United States Patent
Chu et al.

(10) Patent No.: US 11,742,231 B2
(45) Date of Patent: Aug. 29, 2023

(54) MOVABLE WAFER HOLDER FOR FILM DEPOSITION CHAMBER HAVING SIX DEGREES OF FREEDOM

(71) Applicant: Taiwan Semiconductor Manufacturing Co., Ltd., Hsinchu (TW)

(72) Inventors: Hsuan-Chih Chu, Hsinchu (TW); Wen-Hao Cheng, Taichung (TW); Yen-Yu Chen, Taichung (TW); Yi-Ming Dai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 155 days.

(21) Appl. No.: 16/657,841

(22) Filed: Oct. 18, 2019

(65) Prior Publication Data

US 2021/0118700 A1 Apr. 22, 2021

(51) Int. Cl.
*C23C 14/00* (2006.01)
*C23C 14/54* (2006.01)
(Continued)

(52) U.S. Cl.
CPC ............ *H01L 21/673* (2013.01); *B05C 13/00* (2013.01); *B25B 11/00* (2013.01); *B25F 5/02* (2013.01); *B25J 11/0075* (2013.01); *B25J 18/04* (2013.01); *B29C 64/241* (2017.08); *C23C 14/00* (2013.01); *C23C 14/505* (2013.01); *C23C 14/541* (2013.01); *C30B 25/12* (2013.01); *H01J 37/20* (2013.01); *H01L 21/67098* (2013.01);
(Continued)

(58) Field of Classification Search
CPC ......... B05C 11/08; B05D 1/005; G03F 7/162; H01L 21/6833; H05B 2203/037; H05B 2203/002; H05B 2203/003
USPC ............................................... 219/539, 462.1
See application file for complete search history.

(56) References Cited

U.S. PATENT DOCUMENTS 2,813,960 A * 11/1957 Egle et al. ............... H05B 3/28
392/435
4,822,639 A * 4/1989 Fujii ....................... B05C 11/08
118/52
(Continued)

FOREIGN PATENT DOCUMENTS

WO WO-2019181500 A1 * 9/2019 ............. C23C 16/46
WO WO 2019181500 A1 9/2019

*Primary Examiner* — Karl Kurple
(74) *Attorney, Agent, or Firm* — Seed IP Law Group LLP

(57) ABSTRACT

The present disclosure provides a flexible workpiece pedestal capable of tilting a workpiece support surface. The workpiece pedestal further includes a heater mounted on the workpiece support surface. The heater includes a plurality of heating sources such as heating coils. The plurality of heating sources in the heater allows heating the workpiece at different temperatures for different zones of the workpiece. For example, the workpiece can have a central zone heated by a first heating coil, a first outer ring zone that is outside of the central zone heated by a second heating coil, a second outer ring zone that is outside of the first outer ring zone heated by a third heating coil. By using the tunable heating feature and the tilting feature of the workpiece pedestal, the present disclosure can reduce or eliminate the shadowing effect problem of the related workpiece pedestal in the art.

20 Claims, 4 Drawing Sheets

(51) Int. Cl.
*H01L 21/673* (2006.01)
*H01L 21/67* (2006.01)
*H01L 21/66* (2006.01)
*H01L 21/687* (2006.01)
*C23C 14/50* (2006.01)
*B25B 11/00* (2006.01)
*C30B 25/12* (2006.01)
*B25J 11/00* (2006.01)
*B29C 64/241* (2017.01)
*B25J 18/04* (2006.01)
*B25F 5/02* (2006.01)
*H01J 37/20* (2006.01)
*B05C 13/00* (2006.01)

(52) U.S. Cl.
CPC .. *H01L 21/67103* (2013.01); *H01L 21/67115* (2013.01); *H01L 21/67248* (2013.01); *H01L 21/68764* (2013.01); *H01L 21/68785* (2013.01); *H01L 21/68792* (2013.01); *H01L 22/12* (2013.01); *F16C 2322/39* (2013.01); *H01J 2237/20207* (2013.01); *H05B 2203/002* (2013.01); *H05B 2203/003* (2013.01); *H05B 2203/037* (2013.01); *Y10S 269/901* (2013.01)

(56) References Cited

U.S. PATENT DOCUMENTS

| | | | | |
|---|---|---|---|---|
| 5,095,848 | A * | 3/1992 | Ikeno | B05D 1/005 118/52 |
| 5,264,246 | A * | 11/1993 | Ikeno | B05D 1/005 427/240 |
| 5,667,592 | A * | 9/1997 | Boitnott | C23C 14/568 118/719 |
| 5,766,354 | A * | 6/1998 | Ohmori | B05C 11/08 118/319 |
| 6,182,675 | B1 * | 2/2001 | Naka | H01L 21/67051 134/61 |
| 7,645,342 | B2 * | 1/2010 | Emerson | H01L 21/67103 118/725 |
| 10,113,233 | B2 * | 10/2018 | Chang | H01L 21/67248 |
| 2006/0130763 | A1 * | 6/2006 | Emerson | C23C 16/46 118/725 |
| 2008/0032426 | A1 * | 2/2008 | Michaelson | H01L 22/20 438/7 |
| 2011/0180233 | A1 * | 7/2011 | Bera | C23C 16/46 118/725 |
| 2017/0069483 | A1 * | 3/2017 | Razek | H01J 37/32009 |
| 2017/0154804 | A1 | 6/2017 | Angelov et al. | |
| 2017/0352574 | A1 * | 12/2017 | Chen | H01J 37/32422 |
| 2020/0396801 | A1 * | 12/2020 | Unno | H05B 3/265 |
| 2021/0217638 | A1 * | 7/2021 | Hanamachi | H05B 3/68 |

* cited by examiner

MOVABLE WAFER HOLDER FOR FILM DEPOSITION CHAMBER HAVING SIX DEGREES OF FREEDOM

BACKGROUND

In manufacturing semiconductors, film deposition chambers such as chemical vapor deposition (CVD) chambers and physical vapor deposition (PVD) chambers are typically used. Within these chambers, a wafer holder is used to support the wafer, heat the wafer using a heater connected to the holder, and rotate the wafer during the deposition process. In the deposition process, a target material that is located above the wafer is deposited while the wafer holder supporting the wafer is rotating circularly along a plane, for example an x-y plane (where the x-y plane is parallel to the horizon or perpendicular to a gravity vector). Due to the circular shape of the wafer and the position of the target material, some portions of the wafer (e.g., periphery of the wafer, locations near the edges of the wafer) uneven coverage by the deposited target materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
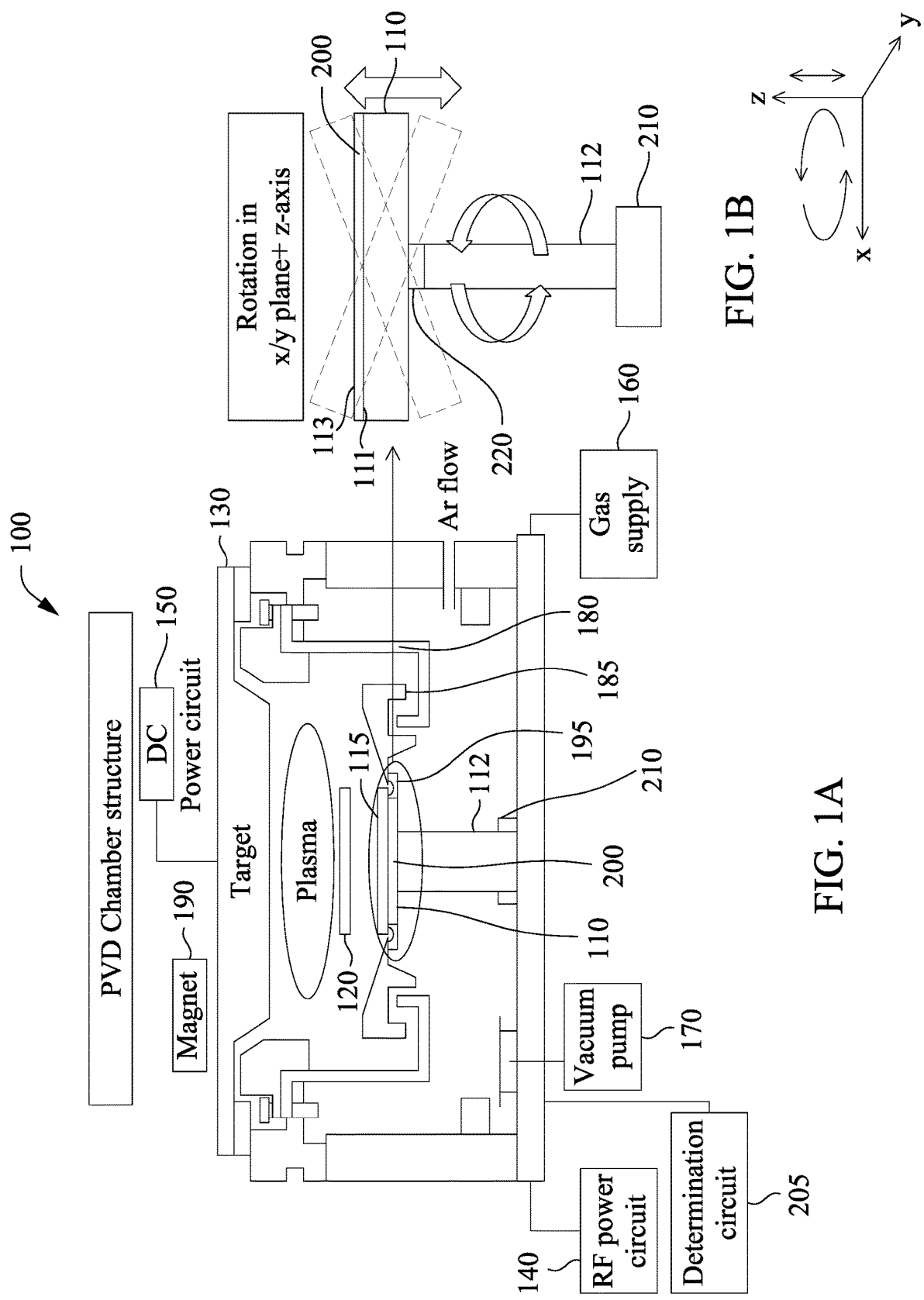
FIG. 1A is a cross-sectional view of a chamber structure including a workpiece holder according to one embodiment of the present disclosure.
FIG. 1B is a cross-sectional view of a workpiece holder according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

The various aspects of the present disclosure will be now detailed in connection with the figures.

FIG. 1A is a cross-sectional view of a chamber structure 100 according to one embodiment of the present disclosure. The chamber structure 100 includes a workpiece pedestal. The workpiece pedestal includes a workpiece holder 110 may also be referred to as a holder 110. The workpiece pedestal is referred to as including the holder 110, a shaft 112, a movable or adjustable joint 220, and a rotating mechanism 210. The specific components of the workpiece pedestal are further detailed in FIG. 1B.

Returning to FIG. 1A, the holder 110 supports a workpiece 115 (e.g., silicon wafers, substrates, or the like) during the various processing on the workpiece 115 (e.g., film deposition process). The holder 110 is, for example, fabricated from ceramic, metal such as aluminum, stainless steel, or combinations thereof. A shutter disk 120 is positioned above the workpiece 115. Generally, a shutter disk 120 is used during cleaning of a target 130 to protect the holder 110 and other components adjacent and around the holder 110. For example, the shutter disk 120 is positioned between the target 130 and the holder 110 to isolate the target 130 and other components to be cleaned during the cleaning process from other components within the chamber 100 which could be damaged by cleaning of the target 130 and pasting materials. In one embodiment, the shutter disk 120 is housed in an enclosure (not shown) attached adjacent to the chamber 100. The shutter disk 120 is connected to a rotating arm (not shown) for moving the shutter disk 120 in a horizontal direction or a vertical direction based on the stage and type of the manufacturing process or cleaning process. For example, during a cleaning process, the rotating arm may place the shutter disk 120 to overlie the workpiece 115 (or overlie the holder 110) to protect the holder 110. In other examples such as during a deposition process, the rotating arm may place the shutter disk 120 inside the enclosure in order not to block the way between the target 130 and the holder 110.

The chamber structure 100 includes an RF (radio frequency) power circuit 140 that is connected to the holder 110 to provide an RF bias voltage to the workpiece 115 during processing. The RF power circuit 140 provides RF bias voltage to the holder 110 and the workpiece 115 so that they are positively biased (in other embodiments, the holder 110 and the workpiece 115 may be negatively biased). Further, the RF power circuit 140 may be connected to other components within the chamber 100 and may provide RF bias voltage to the components.

The chamber structure 100 includes a DC power circuit 150 that is connected to the target 130 and provides the target 130 with a DC bias voltage. For example, in some embodiments in accordance with the present disclosure, the target 130 and the holder 110 are biased relative to each other by a power source (DC or RF) to attract the target material 130 to the workpiece 115 on the holder 110. Further, the DC power circuit 150 may be connected to other components within the chamber 100 and may provide DC bias voltage to the components.

The chamber structure 100 includes a gas supply 160 that controls the gas flow into the chamber 100. For example, in some embodiments in accordance with the present disclosure, the gas supply 160 may provide inert gases such as argon (Ar) gas into the chamber 100 for forming plasma and for use during deposition. In further embodiments, various gases may be supplied to the chamber 100 through the gas supply 160 during etch cleaning, such as hydrogen, oxygen, fluorine-containing gases or other inert gases, depending on the materials to be removed.

The chamber structure 100 includes a vacuum pump 170 is connected to the chamber 100. The vacuum pump 170 is capable of creating a vacuum state in the chamber 100 during processing of the workpiece 115. The chamber structure 100 includes a shielding 180 that surrounds the workpiece 115 during processing and a cover ring 185 maintains the workpiece 115 against the holder 110 during processing. The cover ring 185 is supported by a deposition ring 195.

The target 130 provides material to be deposited on the workpiece 115 during, for example, a PVD process. A magnet 190 enhances uniform consumption of the target material during processing. Plasma is formed between the target 130 and the workpiece 115 from the Ar gas supplied. Ions within the plasma are accelerated toward the target 130 and bombard the target 130 to remove portions of the target material by dislodging portions of the material from the target 130. The dislodged target material is attracted towards the workpiece 115 due to the voltage bias and deposits a film of target material on the workpiece 115.

A deposition ring 195 surrounds the holder 110. A cover ring 185 positioned adjacent to the deposition ring 195 partially overlaps the deposition ring 195. The cover ring 185 and the deposition ring 195 protect the regions of the holder 110 that are not covered by the workpiece 115 during processing (e.g., PVD process, such as sputtering or evaporation). The rest of the chamber 100 is protected by the shielding 180 that is adjacent to the cover ring 185. The cover ring 185 and the deposition ring 195 reduce or minimize materials from the target 130 depositing on the holder 110. During a PVD process, the Ar gas in the chamber 100 is turned into a plasma state. That is, the plasma will have positive Ar ions and electrons. The positive Ar ions will be attracted towards the negative plate where the target 130 is located (e.g., however, in other embodiments, the target 130 may be positively biased using the DC power circuit 150). This attraction force causes the positive Ar ions to move towards the negative plate where the target 130 is located. These ions impact the target 130 with force during the process. This force causes some atoms from the target surface to be dislodged from the target 130 and eventually deposit onto the workpiece 115. If some of the dislodged materials from the target 130 comes in contact with the holder 110 and its surroundings (e.g., walls of the holder 110 and the periphery of the workpiece 115), dislodged materials can deposit onto the holder 110, its surroundings or the periphery of the workpiece 115. The cover ring 185 and the deposition ring 195 cooperate to reduce or eliminate materials from the target 130 from coming in contact with components of the chamber 100 upon which deposition of the target material 130 is undesired.

The deposition ring 195 can be removed to clean these target material deposits from the surfaces of the deposition ring 195. By employing the deposition ring 195, the holder 110 does not have to be dismantled to be cleaned after every PVD process. In addition, the deposition ring 195 protects the edge or periphery surfaces of the holder 110 to reduce their erosion by the energized plasma. In one embodiment, the deposition ring 195 can be formed with a ceramic material, such as aluminum oxide. However, other materials may be used such as synthetic rubbers, thermoset, plastic, thermoplastics or any other material that meets the chemical compatibility, durability, pliability, sealing requirements, flexibility, application temperature, etc. For example, the ceramic material may be molded and sintered using known technologies such as isostatic pressing, followed by machining of the molded sintered preform using suitable machining methods to achieve the shape and dimensions required. However, other known techniques for manufacturing may be used.

In one embodiment, the cover ring 185 is fabricated from a material that can resist erosion by the generated plasma, for example, a metallic material such as stainless steel, titanium or aluminum, or a ceramic material, such as aluminum oxide. However, other suitable materials may be used such as synthetic rubbers, thermoset, plastic, thermoplastics or any other material that meets the chemical compatibility, durability, pliability, sealing requirements, flexibility, application temperature, etc.

The holder 110 according to the present disclosure is capable of moving, e.g., rotating, in the x-y plane as well as the z plane (see the xyz plane legend in FIG. 1B) and being tilted out of the x-y plane (see FIG. 1B). The specific movement of the holder 110 will be detailed in connection with FIG. 1B. In one or more embodiments, because of the flexible movement of the holder 110 which allows for adjustment of the plane that holder 110 is placed and in which holder 110 rotates, the deposition ring 195 and the cover ring 185 may move or stretch in conjunction with the adjustment of the holder 110. For example, synthetic stretchable rubbers may be used for the cover ring 185 and the deposition ring 195 so that at least one of the rings covers the holder 110 during the manufacturing process despite the adjustment in the orientation, e.g., tilting out of the x-y plane, of the holder 110.

In accordance with embodiments of the present disclosure, a heater 200 is provided on the holder 110. During operation, a workpiece 115 is placed on top of the heater 200 that is arranged on a top surface of the holder 110. In one embodiment, the heater 200 may be incorporated as a single, integrated structure as the holder 110. In this embodiment, the heater 200 will be located on the top surface of the holder 110 that contacts the workpiece 115 during the manufacturing process (e.g., PVD process). In other embodiments, the heater 200 may be a separate component that is overlain on top surface of the holder 110. The heater 200 is designed to heat the workpiece 115, e.g., to prepare the workpiece 115 for processing. The specific structure of the heater 200 will be detailed in connection with FIGS. 3A and 3B.

A determination circuit 205 is connected to the chamber 100 to perform and execute the various steps of a manufacturing process carried out in chamber 100. In one embodiment, the determination circuit 205 transmits an output signal to a movable joint 220 (see FIG. 1B) to control a tilt angle of the movable joint 220 and the holder 110 that is coupled to the movable joint 220. The determination circuit 205 is also configured to transmit an output signal to a rotating mechanism 210 (see FIG. 1B) to control a rotation rate of the holder 110 that is coupled to the rotating mechanism 210. The function of the determination circuit 205 is not limited to the above. A determination circuit 205 includes microprocessor, central processing unit, controller circuitry and any other integrated circuit capable of performing instructions. In one embodiment, the determination circuit 205 may control various chambers, components within the chambers, robotic arms or moving means capable of transferring a workpiece such as a wafer, and various sub-processors incorporated within the chamber 100.

Further components such as a memory may be coupled to the determination circuit 205. The memory or computer-readable medium may be one or more of readily available memories such as random access memory (RAM), read only memory (ROM), hard disk, or any other form of digital storage, local or remote. The memory stores predetermined sets of process parameters and cooperates with the determination circuit 205 to execute the predetermined sets of process parameters necessary to carry out specified processes. The determination circuit 205 selects a set of process parameters for operating the PVD process chamber, including the tilt angle of the holder 110 and the rotation rate of the holder 110. For example, each set of process parameters may differ based on which material is being deposited on the workpiece 115. That is, the tilt angle for performing a process for forming aluminum pads (AlPad) on the workpiece, a process for forming nickel (Ni) features on the workpiece, a process for forming copper barrier/seed layers, and other processes may differ from each other. Details of an AlPad process, Ni process, and Copper barrier/seed process are provided below. The process parameters for performing a specific process may also depend on conditions such as temperature of the heater 200, temperature within the chamber 100, pressure within the chamber 100, gas pressure, and other various conditions.

FIG. 1B is a cross-sectional view of a holder 110 according to one embodiment of the present disclosure.

The holder 110 is connected to a rotating mechanism 210 through a shaft 112. The movable joint 220 connects the shaft 112 to the holder 110. That is, the rotating mechanism 210 is connected to one end of the shaft 112 and the movable joint 220 is connected to the other end of the shaft 112. The rotating mechanism 210 includes a driving assembly including a motor, or any electronical/mechanical rotor which can be coupled to the shaft 112 to cause the holder 110 to rotate around a shaft axis (e.g., rotating around x-y plane). Further, any suitable machinery can be used as the rotating mechanism 210 for rotating shaft 112 at a selected rotation rate and is not limited to the examples mentioned.

The movable joint 220 supports the holder 110 on top of shaft 112 such that the holder 110 is able to move or tilt out of an x-y plane and thereby causing the periphery of holder 110 to move in a z-axis direction (e.g., vertical direction). In accordance with embodiments of the present disclosure, a workpiece holder 110 includes a workpiece support surface 111. This workpiece support surface 111 is the surface of the holder 110 upon which a workpiece 115 is supported. This workpiece support surface 111 defines a first plane. For instance, if the holder 110 is not tilted, and maintains 0 degree or 180 degrees position relative to vertical (i.e., a position parallel to the horizon or stated another way, perpendicular to a gravity vector), the first plane is parallel to the x-y plane. By adjusting the movable joint 220, the holder 110 moves the workpiece support surface 111 out of the first plane. In one embodiment, the movable joint 220 includes a joint that has a 360 degree flexible rotation, e.g., a stainless steel ball and socket joint. In another embodiment, the movable joint 220 includes a metal rotary joint capable of tilting the holder 110 with respect to the x-y plane, such as a universal joint or cardan joint. In other embodiments, the movable joint 220 may include a joint having six degrees of freedom (6DoF) which refers to the freedom of movement of a body in a three-dimensional space. For example, a holder supported by the movable joint 220 having 6DoF is free to change position as forward/backward (surge), up/down (heave), left/right (sway) translation in three perpendicular axes (e.g., x, y, z axes), combined with changes in orientation through rotation about three perpendicular axes, often termed yaw (normal axis), pitch (transverse axis), and roll (longitudinal axis).

Figure 2:
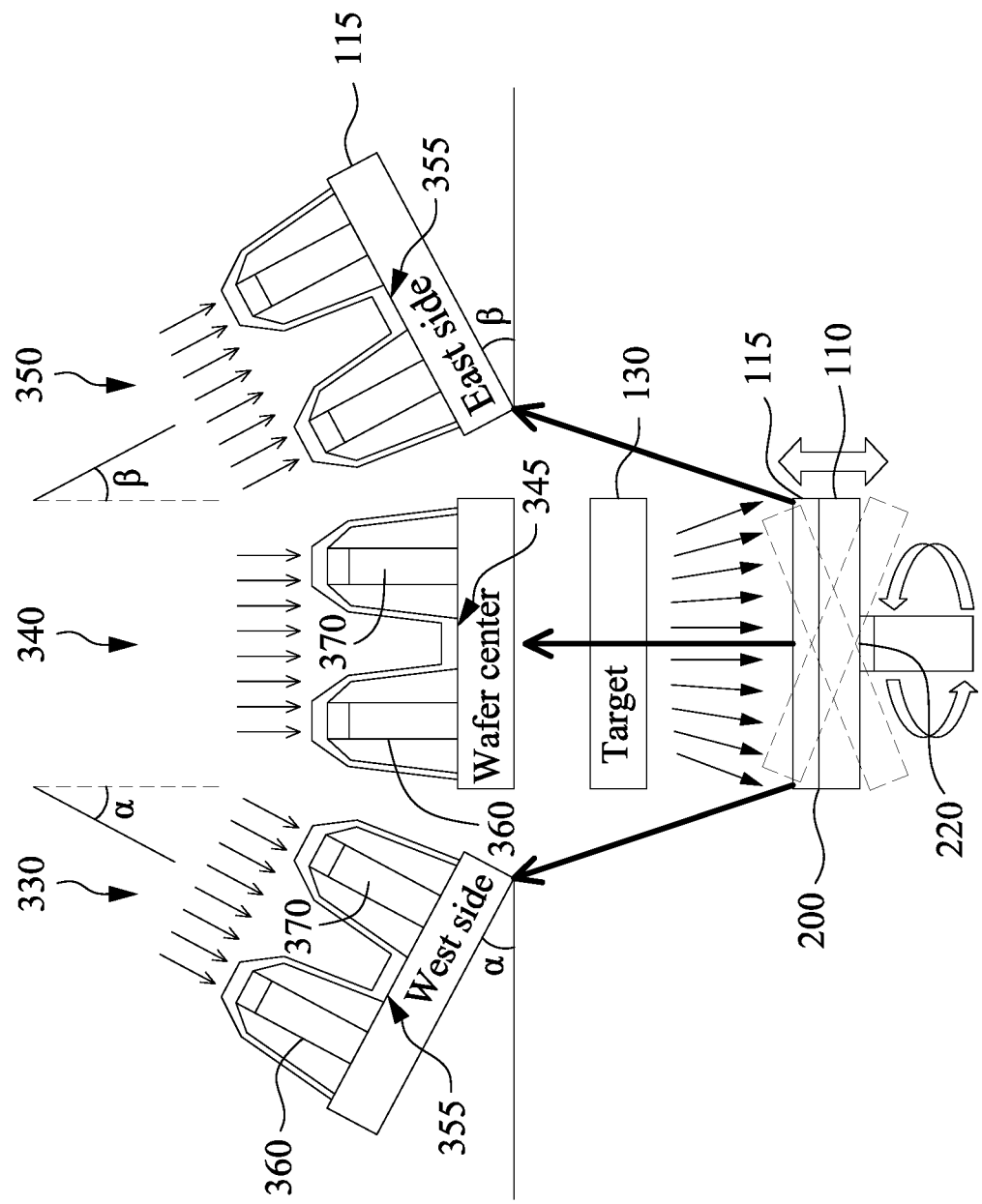
FIG. 2 is a schematic view of a deposition of a target material on various locations of a workpiece according to one embodiment of the present disclosure.

In one embodiment, the movable joint 220 tilts the holder 110 by an angle based on the manufacturing process difference. For example, various equipment and structures are used during the manufacturing process. The hardware equipment each may have a set parameter configured for operating a certain step of the manufacturing process. The different configurations each hardware may have for different processes cause the difference in tilt angle. For instance, a first hardware equipment having certain set parameters may require a first tilt angle for compensating the shadowing effect in the workpiece. On the other hand, a second hardware equipment having a different set parameters may require a second tilt angle that is different form the first tilt angle for compensating the shadowing effect in the workpiece. The deposition angle of the target material 130 as seen from the center of the workpiece 115 is about 90 degrees. As shown from the center portion 340 of the workpiece 115 in FIG. 2, 90 degrees means that the angle formed by the surface of the workpiece 115 (e.g., 0 degrees or 180 degrees) and the direction of the target material 130 (see arrows for the direction in which the target material 130 is deposited) is about 90 degrees, e.g., perpendicular. However in other locations such as the left or west side 330 of the workpiece 115 as shown in FIG. 2, based on the rotation rate of the holder 110, the deposition angle of the target material 130 being deposited on the left side 330 location is α. In accordance with embodiments of the present disclosure, the presence of the movable joint 220 allows the holder 110 to be tilted at an angle α to compensate for the angle from which the target material is deposited onto left side 330, thereby reducing or avoiding the shadowing effect described below with reference to FIG. 2. In some embodiments, the tilt angle α may be increased so as to adjust, e.g., increase or decrease the coverage rate at locations further towards the edge of the workpiece 115. The factors related to controlling temperature of the workpiece 115 by use of multiple heating coils in the heater 200 in accordance with some embodiments of the present disclosure will be explained hereinafter.

A related holder in a related deposition chambers is not capable of being moved to tilt the holder out of an x-y plane. For example, in a related holder in the art, the holder rotates in an x-y plane but the holder is not able to tilt out of the x-y plane to a certain tilt angle. That is, in related art, the tilt angle of the holder is about 0 degree or 180 degrees and is not adjustable. Accordingly, depending on which portion of the workpiece 115 (such as a wafer) is receiving the deposited target materials, a shadowing effect is observed. For example, the left (e.g., west) side and the right (e.g., east) side of a workpiece is susceptible to what is known as a shadowing effect. The shadowing effect occurs when certain features on the workpiece block target materials from being deposited on portions of that feature or other features on the workpiece. In addition, the shadowing effect results in an excessive amount of the target material depositing onto some portions of features that are not in the "shadow" of the blocking features on the workpiece. On the other hand, the center portion of the workpiece often does not experience a shadowing effect and the target material is deposited in a uniform manner, e.g., uniform thickness, on features in a center portion of the workpiece.

For example, when a workpiece surface is subjected to a target material deposition process, e.g., a PVD process, and the workpiece surface includes a first spacer and a second spacer, the "shadow effect' results in the target material being deposited onto the first spacer and/or the second spacer unevenly. In other words, the target material deposited onto portions of the first spacer and the second spacer will be sicker in some locations or in other locations. Depending upon the severity of the shadowing effect, there may be no target material deposited on some portions of the first spacer and/or second spacer. This shadowing effect is a function of the directional nature by which the target material is deposited from the target. The uneven deposition of the target material onto the workpiece may also be a product of the rate at which the holder rotates the workpiece. The variations in thickness of deposited target materials across a wafer results in semiconductor devices produced from these wafers to have irregular and inconsistent electrical/electronic characteristics.

When the shadowing effect occurs on the peripheral portions of the wafer, the center of the wafer shows deposition of target materials to uniform thicknesses. Due to its central location within the wafer, the target material is deposited at a substantially perpendicular angle to the surface of the wafer, including the area between spacers. Accordingly, little or no shadowing effect occurs near the center of the wafer and the target material is deposited in a substantially uniform manner.

On the other hand, the right or east portion of the wafer suffers from the same shadowing effect problem as the left or west portion of the wafer. For example, due to the height of the first spacer 260 and the angle from which the target materials originate, target material is not deposited on some areas of the wafer. Due to the shadow effect, more target material is deposited on some portions of the wafer and less target material is deposited on other portions of the wafer. As noted above, this gives rise to portions of a wafer having non-uniform deposits, e.g., non-uniform thickness of target material, which in turn gives rise to unreliable operational characteristics in semiconductor chips manufactured from such wafer.

FIG. 2 is a schematic view of a deposition of a material on various locations of a wafer according to one embodiment of the present disclosure.

FIG. 2 illustrates a holder 110 according to embodiments of the present disclosure is capable of moving a workpiece supported by the holder by virtue of a movable joint 220. The holder 110 is able to rotate in an x-y plane but is also able tilt at a certain tilt angle out of the x-y plane. The angle to which the holder is able to tilt ranges between about 0 degree to 90 degrees. The particular angle the holder is tilted to will depend in part upon the material being deposited on the workpiece 115. Other various factors will also be considered in determining the tilt angle of the holder 110, such as the temperature applied by the heater 200 and rotational speed of the holder. As shown in FIG. 2, a workpiece 115 supported by a holder 110 in accordance with embodiments of the present disclosure does not experience a substantial shadowing effect at the left or west side 330, right or east side 350 or center side 340. That is, substantially all portions of the workpiece 115 are free from a shadowing effect and the target material is be deposited in a uniform manner at substantially all locations within the workpiece 115. This desirable absence of a shadowing effect is a function of tilting the wafer out of the x-y plane to compensate for the direction that the target materials deposited onto left/west side 330 and right/east side 350 of the wafer.

Referring to FIG. 2, a first spacer 360 and a second spacer 370 are formed on the workpiece 115 on both the center 340 of wafer 115 and the left side 330 of wafer 115. When the holder 110 is rotating at a certain rotation rate, the target material 130 may be deposited uniformly at the left/west side 330 of the workpiece 115 by adjusting the angle by which the workpiece 115 is tilted out of the x-y plane. For example, if the direction or the angle, relative to the vertical direction, at which the target material 130 is deposited onto the workpiece 115 is α, in accordance with embodiments of the present disclosure, the movable joint 220 provides the flexibility and freedom to tilt the holder 110 out of the x-y plane to that same angle α relative to the x-y plane. By tilting the holder 110 and workpiece 115 to an angle α, the workpiece 115 on the left side 330, the direction at which the target material is deposited onto the workpiece 115 is perpendicular to the surface of the workpiece 115. When the direction at which the target material is deposited onto the workpiece is perpendicular to the surface of the workpiece 115, the possibility of the first spacer 360 and the second spacer 370 "shadowing" the deposition of the target material is reduced or removed and the coverage by the target material is complete and the deposits are of uniform or desired thickness. It should be understood, that reference to a uniform thickness of the deposited target material is not limited to situations where the thickness of the deposited target material is the same at all locations. For example, in the embodiment illustrated in FIG. 2, the thickness of the deposited target material on the sides of first spacer 360 and second spacer 370 differs from the thickness of the deposited target material in the area 355 between first spacer 360 and second spacer 370 and the top of first spacer 360 and second spacer 370. Uniform thickness of deposited target material also refers to situations where the thickness of the deposited material on a portion of a feature, for example, a sidewall of first spacer 360 or a sidewall of second spacer 370 is of a uniform thickness while the relative thickness of the deposited target material on a sidewall of first spacer 360 differs from the thickness of the deposited target material on a sidewall of the second spacer 370.

Continuing to refer to FIG. 2, the target material deposited on the center side 340 of the workpiece 115 is uniformly deposited in the areas 345 between the first spacer 360 and the second spacer 370. Due to its central location within the workpiece 115, the rotation rate of the holder 110 does not affect the angle in which the target material 130 originates from. Because the target material 130 is deposited at a substantially perpendicular angle to the first spacer 360, the second spacer 370 and the area 345 between the first and second spacers 360, 370, it is not necessary to tilt the holder 110 to compensate for a shadowing effect at center 340 of workpiece 115. In accordance with embodiments of the present disclosure, holder 110 tilts around its center axis, which in certain embodiments, is aligned with the center axis of the target material 130 in the center axis of holder 110 and shaft 112. With such configuration, when movable joint 220 is activated to tilt holder out of an x-y plane, the distance by which the surface of workpiece 115 at center portion 340 moves in a vertical direction is less than the distance the surface of workpiece at left side 330 and right side 350 moves in a vertical direction.

Similar to the left side 330 of the workpiece 115, in accordance with embodiments of the present disclosure, when the workpiece 115 is tilted out of the x-y plane, the right side 350 of the workpiece 115 is tilted in a complementary way relative to the left side 330 of workpiece 115. For example, if the direction or angle, relative to the vertical direction, at which the target material 130 is deposited onto the workpiece 115 is β, in accordance with embodiments of the present disclosure, the movable joint 220 provides the flexibility and freedom to tilt the holder 110 out of the x-y plane to the same angle β (relative to the x-y plane). By tilting the holder 110 and workpiece 115 to an angle β, the workpiece 115 on the right side 350, the direction in which the target materials is deposited onto the workpiece 115 is perpendicular to the surface of the workpiece 115. When the direction in which the target materials deposited onto the workpiece is perpendicular to the surface of the workpiece 115, the possibility of the first spacer and second spacer "shadowing" the deposition of the target material is reduced or removed and the coverage by the target material is complete and the deposits are of uniform or of a desired thickness. In other words, tilting of the holder 110 causes the surface of the holder 110 and the workpiece to be perpendicular or orthogonal to the direction from which the target material 130 originates and is deposited onto the workpiece. In accordance with embodiments of the present disclosure, when the angle of the holder/workpiece is adjusted in this manner, target material can be deposited onto areas 355 between the first spacer 360 and the second spacer 370 uniformly. Accordingly, the thickness of the deposited target materials will be uniform across the first spacer 360, second spacer 370, and the area 355 therebetween.

Figure 3A:
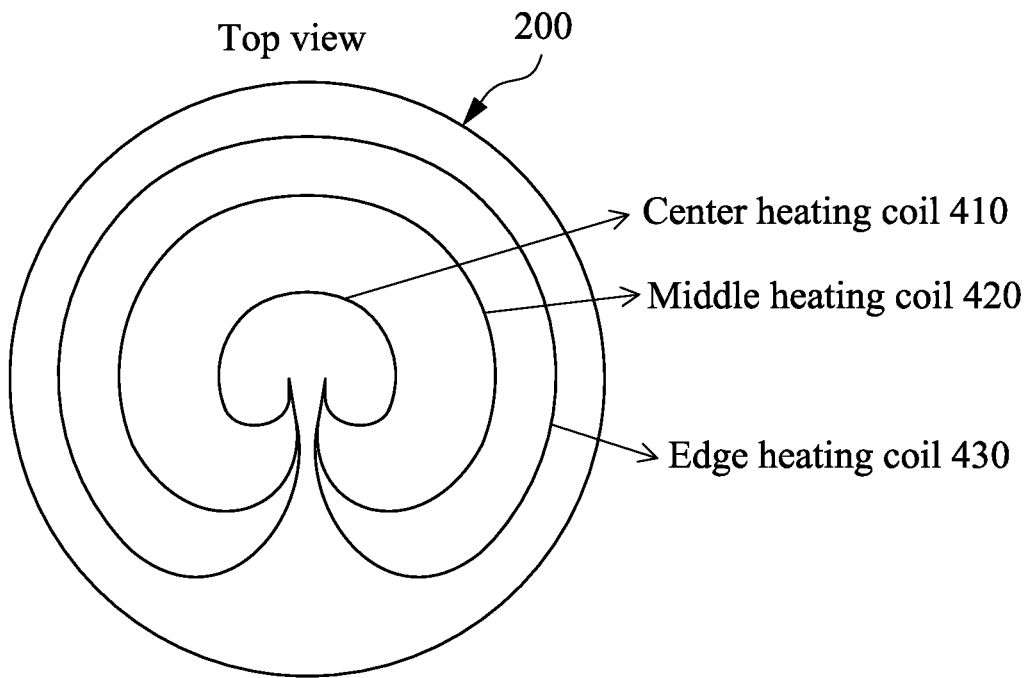
FIG. 3A is a top view of a heater having a plurality of heating coils according to embodiments of the present disclosure.
Figure 3B:
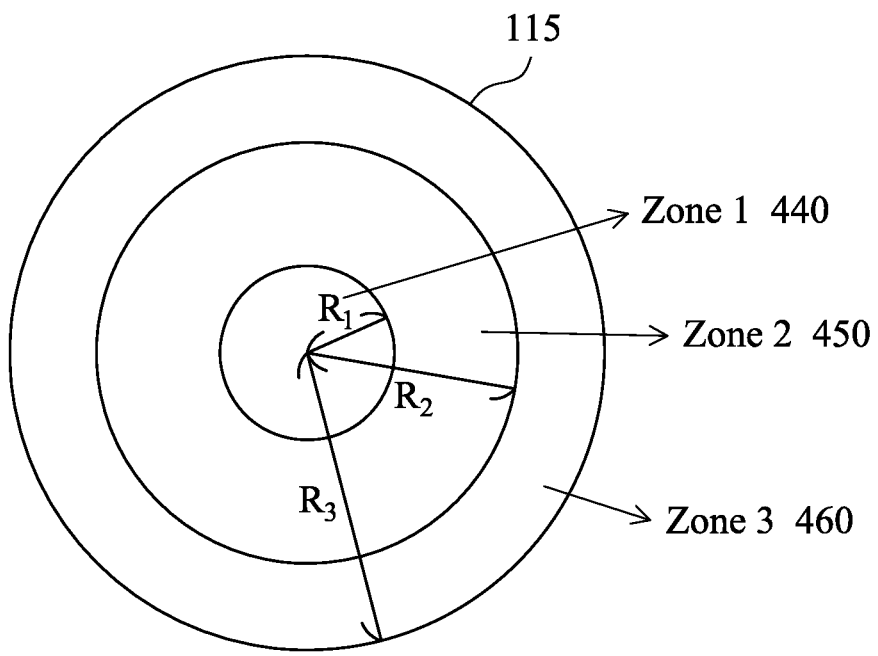
FIG. 3B is a top view of a heater having a plurality of heating zones for tuning the temperature of various locations on a workpiece according to embodiments of the present disclosure.

FIG. 3A is a top view of a heater having a plurality of heating coils according to embodiments of the present disclosure. FIG. 3B is a top view of a workpiece having a plurality of heating zones for tuning the temperature of various locations of the workpiece according to embodiments of the present disclosure.

Referring to FIG. 3A, a heater 200 according to the present disclosure is capable of controlling the temperature of a surface area of the heater 200 by zones. To heat the heater by zones having different temperatures, the heater 200 includes a plurality of heating coils. The heating coils are arranged within the surface of the heater 200 to heat a workpiece 115 to different temperatures at different zones as shown in FIG. 3B. In one embodiment, the heater 200 includes a first heating coil 410 located at the center of the heater 200. The first heating coil 410 increases the temperature of the heater 200 to heat the workpiece 115 at a corresponding location. The first heating coil 410 may increase the temperature to a first temperature to heat a first zone 440 of the workpiece 115 to the same temperature. The first zone 440 has a first radius R1 and the first heating coil 410 may be arranged in the circular area defined by the first radius R1. For example, in the illustrated embodiment, the first heating coil 410 is located within an inner circular area defined by the first radius R1. The present disclosure includes embodiments wherein the first heating coil 410 is arranged differently within the inner circular area defined by the first radius R1. In some embodiments, the first zone 440 and the second zone 450 partially overlap with each other, and the second zone 450 and the third zone 460 partially overlap with each other.

The heater 200 includes a second heating coil 420 located around the circumference or the periphery of the first heating coil 410. The second heating coil 420 increases the temperature of the heater 200 to heat the workpiece 115 at a corresponding location. The second heating coil 420 increases the temperature to a second temperature to heat a second zone 450 of the workpiece 115 to the same temperature. The second zone 450 is in the area outside of the first radius R1 and within a second radius R2. In the illustrated embodiment, the second heating coil 420 is located within a first outer ring area defined by the area between the first radius R1 and the second radius R2. The present disclosure includes embodiments wherein the second heating coil 420 is arranged differently within the first outer ring area defined by the area between the first radius R1 and the second radius R2.

The heater 200 includes a third heating coil 430 located around the circumference or the periphery of the second heating coil 420. The third heating coil 430 increases the temperature of the heater 200 to heat the workpiece 115 at a corresponding location. The third heating coil 430 increases the temperature to a third temperature to heat a third zone 460 of the workpiece 115 to the same temperature. The third zone 460 is in the area outside of the second radius R2 and within a third radius R3. In the illustrated embodiment, the third heating coil 430 is located within a second outer ring area defined by the area between the second radius R2 and the third radius R3. The third heating coil 430 is arranged adjacent to second heating coil 420. In the illustrated embodiment, the third heating coil 430 is arranged in the area outside of the second radius R2 and within the third radius R3. That is, the third heating coil 430 is located within a second outer ring area defined by the area between the third radius R3 and the second radius R2. The present disclosure includes embodiments wherein the third heating coil 430 is arranged differently within the second outer ring area defined by the area between the second radius R2 and the third radius R3.

Other various arrangements of the heating coils may be employed and the arrangements are not necessarily fixated to the embodiments shown in the drawing.

In one embodiment, the first, second, and third heating coils are formed integral with the heater 200. Further, the heater 200 is arranged at a first side of the holder 110 and formed integrally with the holder 110. In another embodiment, the heater 200 is removably attached to the first side of the holder 110.

In one or more embodiments, the movable joint 220 tilts the holder 110 out of the x-y plane and the plurality of heating coils on the heater 200 are controlled based on instructions from the determination circuit 205 which retrieves the process parameters from the memory (e.g., certain tilt angles for certain processes, the temperatures of zones based on certain deposition materials, rotation speed of holder, etc.). For example, in accordance with at least some embodiments of the present disclosure, in order to achieve uniform deposition of target materials, the determination circuit 205 of the chamber 100 controls at least one of the tilt angle of the holder 110, the rotation rate of the holder 110, and/or the temperatures of the first, second, and third heating coils. In other examples, the determination circuit 205 of the chamber 100 controls a combination of the tilt angle of the holder 110, the rotation rate of the holder 110, the temperatures of the first, second, and third heating coils to reduce or eliminate the shadowing effect and produce deposits of the target materials 130 of uniform or desired thickness and coverage.

In one embodiment, the holder 110 according to the present disclosure may be utilized in an AlPad deposition process on the workpiece 115.

When a holder 110 according to the present disclosure is used in an AlPad deposition process, the tilt angle of holder 110 is adjusted to tilt the workpiece 115. This results in the left side of the workpiece being elevated or lowered and the right side of the workpiece being lowered or elevated. Further, in accordance with embodiments of the present disclosure, the temperature of each left side, center, and right side of the workpiece is controlled to further promote a uniform deposition process. For example, the left side and the corresponding location having a similar radius on the right side is heated to about 200° C. On the other hand, the center of the workpiece is heated to a temperature higher than the right and left side. For example, the center is heated to temperature greater than about 200° C., e.g., about 250° C. By controlling the tilt angle as well as tuning the temperature for zones of the workpiece 115, non-uniform or non-existent deposition of the Al on portions of the workpiece is reduced or avoided, resulting in deposited target material with uniform thickness across substantially all locations of the workpiece 115 and high coverage rate.

In another embodiment, the holder 110 according to the present disclosure is utilized in a process to deposit Ni on the workpiece 115. Using the holder 110 according to the present disclosure in a process for depositing Ni on a workpiece achieves uniform thickness of Ni deposits across the workpiece 115. In accordance with this embodiment, the temperature of each left side, center, and right side of a workpiece is controlled to facilitate the uniform deposition on Ni onto the workpiece. Similar to the AlPad deposition process, in the Ni process, the first heating coil controls the temperature of the first zone, the second heating coil controls the temperature of the second zone, the third heating coil controls the temperature of the third zone and the temperatures of these different is set to be the same or different. In one embodiment, the temperatures of the zones may decrease as the zones are located further away from the central part of the heater 200. In other embodiments depositing materials other than Ni, the temperatures of the zones may increase as the zones are located further away from the central part of the heater 200. In further embodiments, the temperatures of the first zone, the second zone, and the third zone need not be increased in a continuous manner. For example, the temperature of the second zone may be set to a higher temperature than the first zone, and the temperature of the third zone may be set to a lower temperature than the second zone but a higher temperature than the first zone.

In another embodiment, the holder 110 according to the present disclosure is utilized in a Cu deposition process. Using the holder 110 according to the present disclosure in a Cu deposition process produces Cu deposits of uniform thickness across the workpiece 115. Further, the temperature of each left side, center, and right side is controlled to facilitate the uniform deposition of Cu by use of multiple heating coils.

Figure 4:
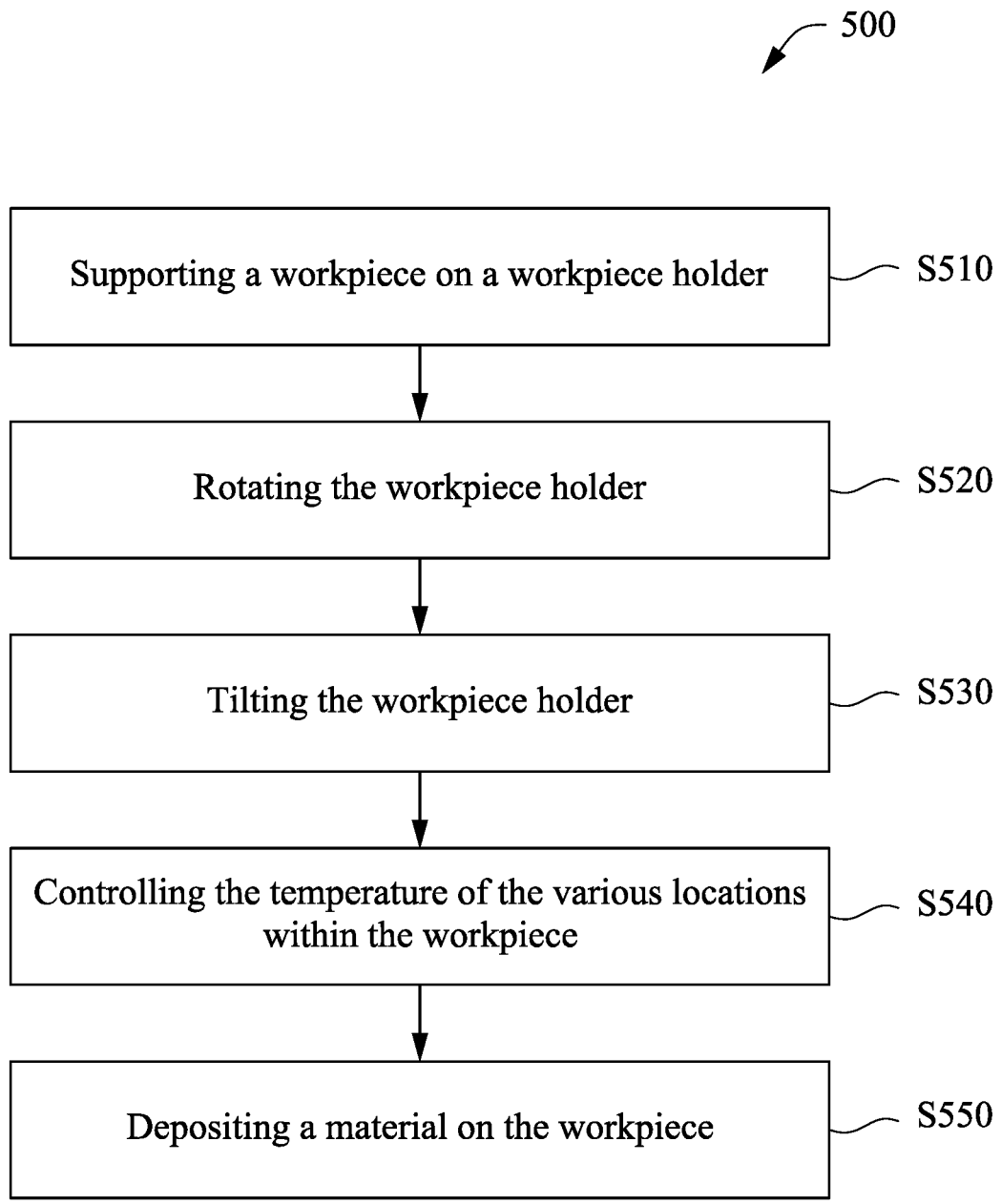
FIG. 4 is a flow chart of operating a workpiece holder to perform film deposition according to embodiments of the present disclosure.

FIG. 4 is a flow chart 500 of a method of depositing a target material in a deposition chamber that includes a holder 110 according to embodiments of the present disclosure. At step S510, a workpiece 115 is supported on a workpiece holder 110. At step S520, the workpiece is rotated using the workpiece holder 110. At step S530, the workpiece holder 110 is tilted out of an x-y plane to a certain tilt angle before, during or after the rotation of the workpiece holder 110. At step S540, a heater mounted on the workpiece holder 110 is used to heat various locations of the workpiece to adjust the temperature of the workpiece 115 at the various locations. The heater 200 includes multiple coils beneath the surface of the heater 200 which provide thermal energy to heat the workpiece 115 at different zones corresponding to the locations of each coil. By utilizing these multiple coils in the heater 200, the workpiece holder 110 can be tilted to a specific tilt angle relative to an x-y plane and control the temperature at various locations of the workpiece 115. Controlling the tilt angle of the holder and controlling the temperature of the workpiece mitigates the effect of "shadowing" which can result in uneven or non-existence coverage of portions of the workpiece and also increases the uniformity of the target material deposited on the workpiece 115. In other embodiments, the tilting step at S530 can be performed prior to the rotating step at step S520. In yet other embodiments, the temperature controlling step at S540, may be performed prior to step S530 or S520. Other orders of performing the steps of S520, S530, and S540 may be implemented. At step 550, the target material 130 is deposited onto the workpiece 115.

In one embodiment, the step S530 includes the step of tilting the workpiece holder 110 to a first angle (e.g., angle α as shown in FIG. 2) to deposit materials of the target material 130 at a first edge (e.g., left side 330) of the workpiece 115. The first edge is spaced apart from a central region (e.g., center side 340) of the workpiece 115. The step S530 further includes the step of tilting the workpiece holder 110 to a second angle (e.g., angle β as shown in FIG. 2) to deposit materials of the target material 130 at a second edge (e.g., right side 350) of the workpiece 115. The second edge is spaced apart from the central region of the workpiece 115 and the second edge is located opposite of the first edge. For example, the second edge may be a distance X away from the center of the workpiece holder 110. The first edge may also be distance X away from the center of the workpiece holder 110 but is located on a side of the workpiece that is opposite from the second edge. In some embodiments, if the first edge and the second edge are equally distanced from the center (e.g., X away from the center), the angle α for the first edge and the angle β for the second edge will be the same angle.

In one embodiment, the step S540 includes the step of providing a heater 200 on the workpiece holder 110 and the heater 200 having a first zone and a second zone on a first surface 113 of the heater 200. The step S540 further includes the step of tuning the first zone to a first temperature and the step of tuning the second zone to a second temperature. The second temperature may be different from the first temperature. For example, the first zone may be located at a center of the first surface 113 of the heater, and the second zone may be arranged to surround the first zone.

In one or more embodiments, the determination circuit 205 simultaneously or subsequently controls the thermal energy output by the heater 200 to provide zones heated to the first and second temperatures and the tilt of the holder 110 to achieve uniform deposition of the target material 130 onto the workpiece 115. In further embodiments, the heater 200 includes a third zone capable of being heated by a third coil. In this embodiment, the determination circuit 205 simultaneously or subsequently controls the thermal energy output by the heater to provide zones heated to first, second, and third temperatures and the tilt of the holder 110 to achieve uniform deposition of the target material 130 on the workpiece 115.

Embodiments in accordance with the present disclosure provide a flexible workpiece pedestal capable of tilting a workpiece support surface 111 (e.g., surface of the holder 110) out of an x-y plane to mitigate shadowing effects. The workpiece pedestal further includes a heater 200 mounted on the workpiece support surface 111. The heater 200 includes a plurality of heating sources such as heating coils. The plurality of heating sources in the heater 200 allows heating different zones of the workpiece 115 to different temperatures. For example, the workpiece 115 can have a central zone 440 heated by a first heating coil 410, a first outer ring zone 450 that is outside of the central zone 440 heated by a second heating coil 420, a second outer ring zone 460 that is outside of the first outer ring zone 450 heated by a third heating coil 430. By using this tunable heating feature and the tilting feature of the workpiece pedestal, embodiments in accordance with the present disclosure reduce or eliminate the negative results produced by the shadowing effect observed when related workpiece pedestal in the art are employed in a deposition process.

One aspect of the present disclosure provides a workpiece pedestal for processing a workpiece. The workpiece pedestal includes: a shaft having a first end and a second end; a workpiece holder connected to the first end of the shaft, the workpiece holder including a workpiece support surface for supporting a workpiece, the workpiece support surface defining a first plane; a movable joint between the shaft and the workpiece holder, the movable joint including a movable joint surface and connecting the workpiece holder to the first end of the shaft, the movable joint being tiltable into and out of the first plane; and a rotating mechanism connected to the second end of the shaft, the rotating mechanism, in operation, rotating the shaft.

In one embodiment, the workpiece pedestal further includes: a heater on the circular support region of the holder. The heater has a first surface and in use, contacts the workpiece. The heater has first, second, and third heating coils on the first surface, wherein the first heating coil heats a first zone of the first surface, the second heating coil heats a second zone of the first surface, and the third heating coil heats a third zone of the first surface.

Another aspect of the present disclosure provides a film deposition chamber. The film deposition chamber includes: a workpiece pedestal, the workpiece pedestal includes a shaft having a first end and a second end, the shaft configured to rotate along a shaft axis; a holder on the first end of the shaft, the holder including a support region; a movable joint between the shaft and the holder, the movable joint configured to tilt the holder; a rotating mechanism connected to the second end of the shaft to control a rotation rate along the shaft axis; and a determination circuit connected to the workpiece pedestal to electrically control movement of the movable joint and the rotating mechanism.

Another aspect of the present disclosure provides a method. The method includes: supporting a workpiece on a workpiece holder within a material deposition chamber; rotating the workpiece holder; tilting the workpiece holder in response to an output of a determination circuit; controlling a temperature of the workpiece; and depositing a material on the workpiece.

In one embodiment, the step of tilting the workpiece holder in response to an output of a determination circuit includes: the step of tilting the workpiece holder to a first angle to deposit materials of the film at a first edge of the workpiece, the first edge spaced apart from a central region of the workpiece; and the step of tilting the workpiece holder to a second angle to deposit materials of the film at a second edge of the workpiece, the second edge spaced apart from the central region of the workpiece and the second edge located opposite of the first edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A workpiece pedestal for physical vapor deposition processing, comprising:
   a shaft having a first end and a second end;
   a workpiece holder connected to the first end of the shaft, the workpiece holder including a workpiece support surface for supporting a workpiece, the workpiece support surface defining a first plane;
   a movable joint between the shaft and the workpiece holder, the movable joint connecting the workpiece holder to the first end of the shaft, the movable joint being tiltable into and out of the first plane;
   a heater on a circular support surface of the holder, the heater having a first surface which, in use, contacts the workpiece, the heater including a first heating coil, a second heating coil, and a third heating coil arranged within the first surface of the heater; and
   a rotor connected to the second end of the shaft, the rotor, in operation, rotating the shaft,
   wherein the first heating coil has a first end and a second end opposite of the first end, the first heating coil is continuous and contiguous between the first end of the first heating coil and the second end of the first heating coil,
   wherein the second heating coil has a first end of the second heating coil and a second end of the second heating coil opposite of the first end of the second heating coil,
   wherein the second heating coil is continuous and contiguous between the first end of the heating coil and the second end of the second, heating coil, and the first end of the second heating coil is connected the first end of the first heating coil and said second end of the second heating coil is connected to the second end of the second heating coil,
   wherein the third heating coil has a first end and a second end opposite of the first end of the third heating coil,
   wherein the third heating coil is continuous and contiguous between the first end of the third heating coil and the second end of the third heating coil, and the first end of the third heating coil is connected to the first end of the first heating coil and the second end of the third heating coil is connected to the second end of the first heating coil,
   wherein the first heating coil is arranged to surround a circular area,
   wherein the second heating coil extends outward and surrounds the circular area of the first heating coil, and
   wherein the third heating coil extends outward and surrounds the second heating coil and the circular area of the first heating coil.

2. The workpiece pedestal of claim 1,
   wherein the first heating coil heats a first zone of the first surface, the second heating coil heats a second zone of the first surface, and the third heating coil heats a third zone of the first surface.

3. The workpiece pedestal of claim 2, wherein a temperature of each of the first, second, and third zones can be controlled to a different set of a range of temperatures based on the respective first, second, and third heating coil.

4. The workpiece pedestal of claim 1, wherein the movable joint tilts the workpiece holder based on a rotation rate of the shaft.

5. The workpiece pedestal of claim 4, wherein the movable joint is tiltable to about 0 to 90 degrees out of the first plane.

6. The workpiece pedestal of claim 4, wherein the movable joint has six degrees of freedom of movement in a three-dimensional space.

7. The workpiece pedestal of claim 2, wherein the first zone heated by the first heating coil is located on a center of the first surface, the second zone heated by the second heating coil is adjacent to the first zone and outside a circumference of the first zone, the third zone heated by the third heating coil is adjacent to the second zone and is located along an edge of the first surface of the heater.

8. The workpiece pedestal of claim 2, wherein the first zone and the second zone partially overlap with each other, and the second zone and the third zone partially overlap with each other.

9. A workpiece pedestal for physical vapor deposition processing, comprising:
a shaft having a first end and a second end, the shaft configured to rotate along a shaft holder;
a holder on the first end of the shaft, the holder including a support surface;
a movable joint between the shaft and the holder, the movable joint configured to tilt the holder;
a heater on the support surface of the holder, the heater having a first surface which, in use, contacts the workpiece, the heater including first, second, and third heating coils, and the first heating coil, second heating coil, and the third heating coil being arranged within the first surface of the heater;
a rotor connected to the second end of the shaft to control a rotation rate along the shaft axis,
wherein the movable joint is configured to tilt at a tilt angle which concurrently tilts the holder attached to the movable joint to a corresponding tilt angle,
wherein the first heating coil has a first end and a second end opposite of the first end and the first heating coil continuously and contiguously extends between the first end of the first heating coil and the second end of the first heating coil,
wherein the second heating coil has a first end of the second heating coil and a second end of the second heating coil opposite of the first end of the second heating coil, the second heating coil is continuous and contiguous between the first end of the second heating coil and the second end of the second heating coil, the first end of the second heating coil is connected to the first end of the first heating coil and the second end of the second heating coil is connected to the second end of the first heating coil, and the second heating coil extends between the first end and the second end of the first heating coil, and
wherein the third heating coil has a first end and a second end opposite of the first end of the third heating coil, the third heating coil is continuous and contiguous between the first end of the third heating coil and the second end of the third heating coil, the first end of the third heating coil is connected to the first end of the first heating coil and the second end of the third heating coil is connected to the second end of the first heating coil, and the third heating coil extends between the first end and the second end of the first heating coil,
wherein the first heating coil is arranged to surround a circular area,
wherein the second heating coil extends outward and surrounds the circular area of the first heating coil, and
wherein the third heating coil extends outward and surrounds the second heating coil and the circular area of the first heating coil.

10. The workpiece pedestal of claim 9, wherein the movable joint is capable of tilting left and right with respect to the shaft axis.

11. The workpiece pedestal of claim 9,
wherein the first heating coil heats a first zone of the first surface, the second heating coil heats a second zone of the first surface, and the third heating coil heats a third zone of the first surface.

12. The workpiece pedestal of claim 11, wherein the first zone heated by the first heating coil, the second zone heated by the second heating coil, and the third zone heated by the third heating coil is configured to be heated at a different temperature from each other.

13. The workpiece pedestal of claim 11, wherein the first zone heated by the first heating coil is located on a center of the first surface, the second zone heated by the second heating coil is adjacent to the first zone and outside a circumference of the first zone, and the third zone heated by the third heating coil is adjacent to the second zone and is located along an edge of the first surface of the heater.

14. A workpiece pedestal for physical vapor deposition processing, comprising:
a shaft having a first end and a second end, the shaft configured to rotate along a shaft axis;
a holder on the first end of the shaft, the holder including a circular support region, the circular support region defining a first plane;
a first heating element, a second heating element, and a third heating element adjacently located within the circular support region of the holder,
the first heating element having a first end of the first heating element, and a second end of the first heating element opposite of the first end of the first heating element, the second heating element including a circular portion and a linear portion adjacent to the circular portion, the linear portion of the second heating element coupled to the first end of the first heating coil, the circular portion of second heating element extends outward and surrounds the first heating element, the second heating element coupled to the second end of the first heating element;
a movable joint connected at the first end of the shaft, the movable joint configured to tilt the holder at a tilt angle; and
a rotating mechanism connected to the second end of the shaft to control a rotation rate along the shaft axis,
wherein the first heating element is continuous and contiguous between the first end of the first heating element and the second end of the first heating element,
wherein the second heating element has a first end and a second end opposite of the first end, the second heating element is continuous and contiguous between the first end of the second heating element and the second end of the second heating element, the first end of the second heating element is connected at the first end of the first heating element and the second end of the second heating element is connected at the second end of the first heating element, and the second heating element extending between the first end and the second end of the first heating coil, wherein the third heating element has a first end of the third heating element and a second end of the third heating element, opposite of the first end the third heating element, the third heating element is continuous and contiguous between the first end of the third heating element and the second end of the third heating element, the first end of the third heating element is connected the first end of the first heating coil and the second end of the third heating coil is connected the second end of the first heating coil, and third heating element extending between the first end and the second end of the first heating coil, wherein the first heating element is arranged to surround a circular area, where the second heating coil extends outward and surrounds the circular area of the first heating coil, and wherein the third heating coil extends outward and surrounds the second heating coil and the circular area of the first heating coil.

15. The workpiece pedestal of claim 14, wherein the first heating element is located at a first zone of the circular supporting region and the second heating element is located at a second zone of the circular supporting region.

16. The workpiece pedestal of claim 15, wherein the first zone includes a central area of the circular supporting region, and the second zone includes an outer area of the first zone.

17. The workpiece pedestal of claim 16, wherein the first heating element includes a first heating coil having a spiral shape, and the second heating element includes a second heating coil having a spiral shape.

18. The workpiece pedestal of claim 14, wherein the movable joint tilts the workpiece holder based on a rotation rate of the shaft.

19. The workpiece pedestal of claim 14, wherein the movable joint is tiltable to about 0 to 90 degrees out of the first plane.

20. The workpiece pedestal of claim 14, wherein the movable joint has six degrees of freedom of movement in a three-dimensional space.

* * * * *